United States Patent
Tsuda et al.

(10) Patent No.: US 10,784,451 B2
(45) Date of Patent: Sep. 22, 2020

(54) FLEXIBLE LAMINATE HAVING VISCOELASTICITY AND FLEXIBLE DISPLAY USING SAME

(71) Applicant: Dow Corning Toray Co., Ltd., Tokyo (JP)

(72) Inventors: Takeaki Tsuda, Tokyo (JP); Michitaka Suto, Odawara (JP); Haruna Mizuno, Chiba (JP); Haruhiko Furukawa, Chiba (JP); Maki Itoh, Ichikawa (JP)

(73) Assignee: DOW TORAY CO., LTD., Tokyo (JP)

( * ) Notice: Subject to any disclaimer, the term of this patent is extended or adjusted under 35 U.S.C. 154(b) by 88 days.

(21) Appl. No.: 15/999,682

(22) PCT Filed: Feb. 17, 2017

(86) PCT No.: PCT/JP2017/005979
§ 371 (c)(1),
(2) Date: Aug. 17, 2018

(87) PCT Pub. No.: WO2017/142078
PCT Pub. Date: Aug. 24, 2017

(65) Prior Publication Data
US 2020/0028100 A1 Jan. 23, 2020

(30) Foreign Application Priority Data
Feb. 18, 2016 (JP) ................... 2016-028696

(51) Int. Cl.
*H01L 51/00* (2006.01)
*H01L 27/32* (2006.01)
(Continued)

(52) U.S. Cl.
CPC .......... *H01L 51/0097* (2013.01); *B32B 7/022* (2019.01); *B32B 7/12* (2013.01); *H01L 27/3244* (2013.01); *B32B 2457/20* (2013.01)

(58) Field of Classification Search
CPC . H01L 51/0097; H01L 27/3244; B32B 7/022; B32B 7/12
See application file for complete search history.

(56) References Cited

U.S. PATENT DOCUMENTS 3,930,041 A * 12/1975 Komatsu ................ B65B 51/10
                                                        426/396
4,350,734 A *  9/1982 Hammond ............... B32B 5/18
                                                        428/308.4
(Continued)

FOREIGN PATENT DOCUMENTS

JP    2005526296 A    9/2005
JP    2008248226 A    10/2008
(Continued)

OTHER PUBLICATIONS

International Search Report with translation for PCT/JP2017/005979 dated May 23, 2017, 5 pages.
(Continued)

*Primary Examiner* — Ida M Soward
(74) *Attorney, Agent, or Firm* — Warner Norcross + Judd LLP

(57) ABSTRACT

A flexible laminate, in which it is possible to achieve both flexibility and durability, is disclosed. A flexible display using the flexible laminate is also disclosed. The flexible laminate includes one or more units of a laminate structure in which two hard layers interposing one or more intermediate layers therebetween are bonded together as one unit. The intermediate layer has viscoelasticity. When the flexible laminate is bent, a neutral plane is formed in each inner portion of the hard layers that are bonded together to interpose the intermediate layer therebetween.

19 Claims, 4 Drawing Sheets

(51) Int. Cl.
*B32B 7/02* (2019.01)
*B32B 7/12* (2006.01)
*B32B 7/022* (2019.01)

(56) References Cited

U.S. PATENT DOCUMENTS

| | | | | |
|---|---|---|---|---|
| 5,622,580 | A * | 4/1997 | Mannheim | B32B 17/10018 100/295 |
| 5,633,069 | A * | 5/1997 | Shimizu | H05K 3/0014 428/192 |
| 5,937,494 | A * | 8/1999 | Meyer | H05K 1/118 257/E23.177 |
| 9,053,651 | B2 * | 6/2015 | Yeo | G09G 5/00 |
| 9,770,888 | B2 * | 9/2017 | Payen | B32B 17/10036 |
| 9,933,886 | B2 * | 4/2018 | Kim | G06F 3/044 |
| 2003/0214612 | A1 | 11/2003 | Freeman | |
| 2009/0081911 | A1 * | 3/2009 | Yang | B32B 27/32 442/77 |
| 2010/0011641 | A1 * | 1/2010 | Hill | G09F 1/06 40/606.12 |
| 2010/0215952 | A1 * | 8/2010 | Takamatsu | B32B 17/10 428/339 |
| 2011/0105637 | A1 | 5/2011 | Fujita et al. | |
| 2011/0259463 | A1 * | 10/2011 | Song | B32B 1/08 138/172 |
| 2015/0048349 | A1 * | 2/2015 | Kawata | H01L 51/0097 257/40 |
| 2015/0185782 | A1 * | 7/2015 | Kim | H01L 51/0097 349/12 |
| 2015/0201487 | A1 * | 7/2015 | Kee | G02F 1/133305 361/749 |
| 2016/0226015 | A1 | 8/2016 | Kauhaniemi et al. | |
| 2018/0156296 | A1 * | 6/2018 | Alexander | B60R 13/0815 |
| 2019/0011954 | A1 * | 1/2019 | Chu | B32B 7/12 |
| 2019/0033918 | A1 * | 1/2019 | Park | G06F 3/044 |

FOREIGN PATENT DOCUMENTS

| | | |
|---|---|---|
| JP | 2009026883 A | 2/2009 |
| JP | 2009229667 A | 10/2009 |
| JP | 2011526629 A | 10/2011 |
| JP | 2014153711 A | 8/2014 |
| JP | 2014227453 A | 12/2014 |
| JP | 2015182393 A | 10/2015 |
| WO | WO2004003645 A1 | 1/2004 |
| WO | WO2009148722 A2 | 12/2009 |

OTHER PUBLICATIONS

"Information Display", Jan./Feb. 2015, vol. 31, No. 1 p. 6-11, "Technologies for Flexible AMOLEDs" (Soonkwang Hong et al), 7 pages.

"Information Display", Jan./Feb. 2015, vol. 31, No. 1 p. 12-16, "Foldable AMOLED Display Development: Progress and Challenges" (Jing-Yi Yan et al), 6 pages.

English language abstract for JP2008248226 (A) extracted from j-platpat.inpit.go.jp database on Jul. 17, 2018, 1 page; and machine assisted translation from Google Patents on Sep. 14, 2018, 9 pages.

English language abstract for JP200926883 (A) extracted from j-platpat.inpit.go.jp database on Jul. 17, 2018, 1 page; and machine assisted translation from Google Patents on Sep. 14, 2018, 4 pages.

English language abstract for JP2009229667 (A) extracted from j-platpat.inpit.go.jp database on Jul. 17, 2018, 1 page; and machine assisted translation from Google Patents on Sep. 14, 2018, 10 pages.

English language abstract and machine assisted translation for JP2014153711 (A) extracted from j-platpat.inpit.go.jp database on Jul. 17, 2018, 16 pages.

English language abstract for JP2014227453 (A) extracted from j-platpat.inpit.go.jp database on Jul. 17, 2018, 1 page; and machine assisted translation from Google Patents on Sep. 14, 2018, 11 pages.

English language abstract for JP2015182393 (A) extracted from j-platpat.inpit.go.jp database on Jul. 17, 2018, 1 page; and machine assisted translation from Google Patents on Sep. 14, 2018, 8 pages.

* cited by examiner

[FIG. 1]
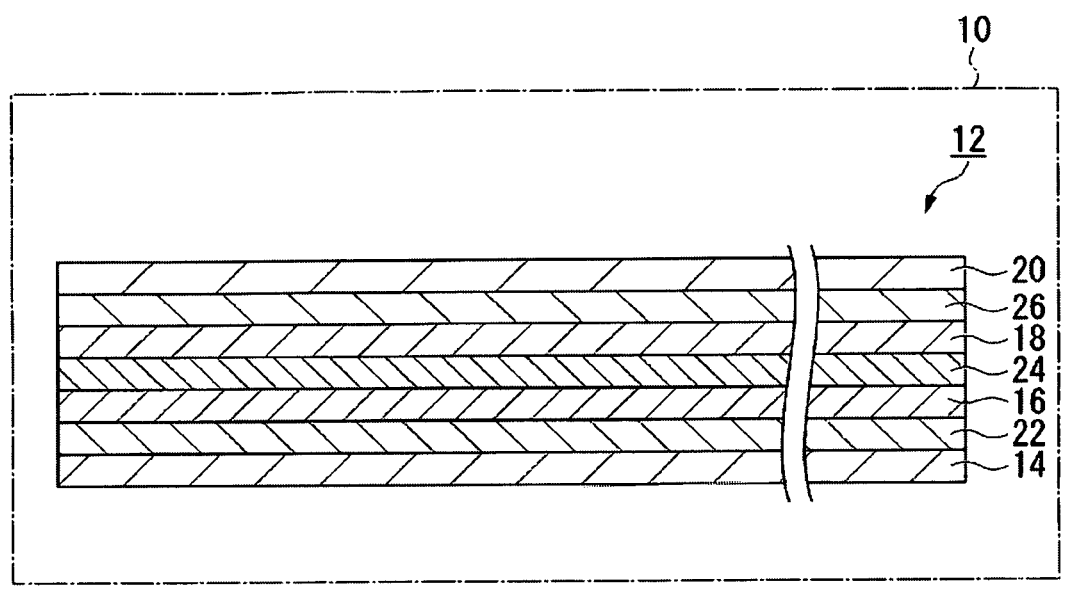

[FIG. 2]
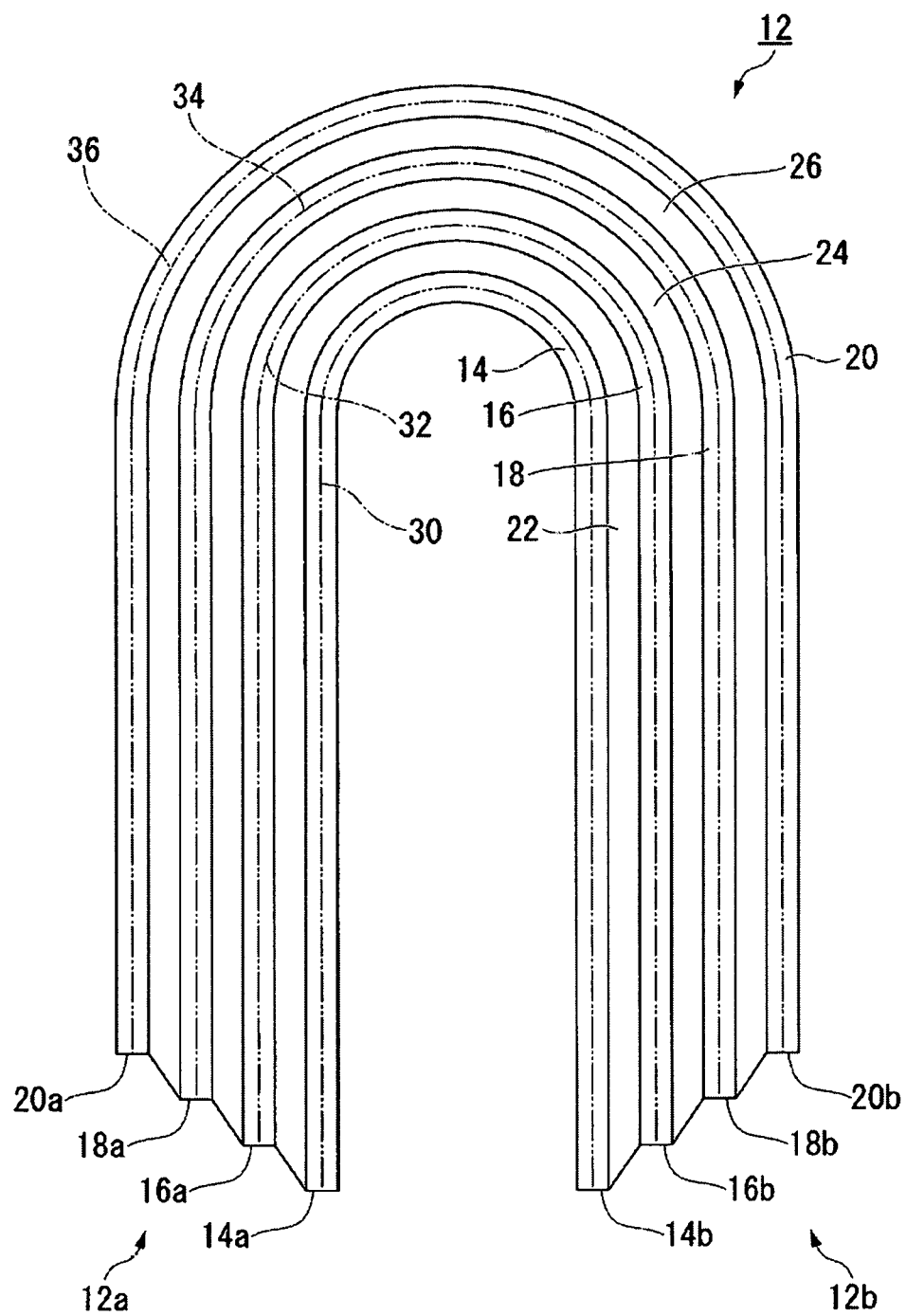

[FIG. 3]
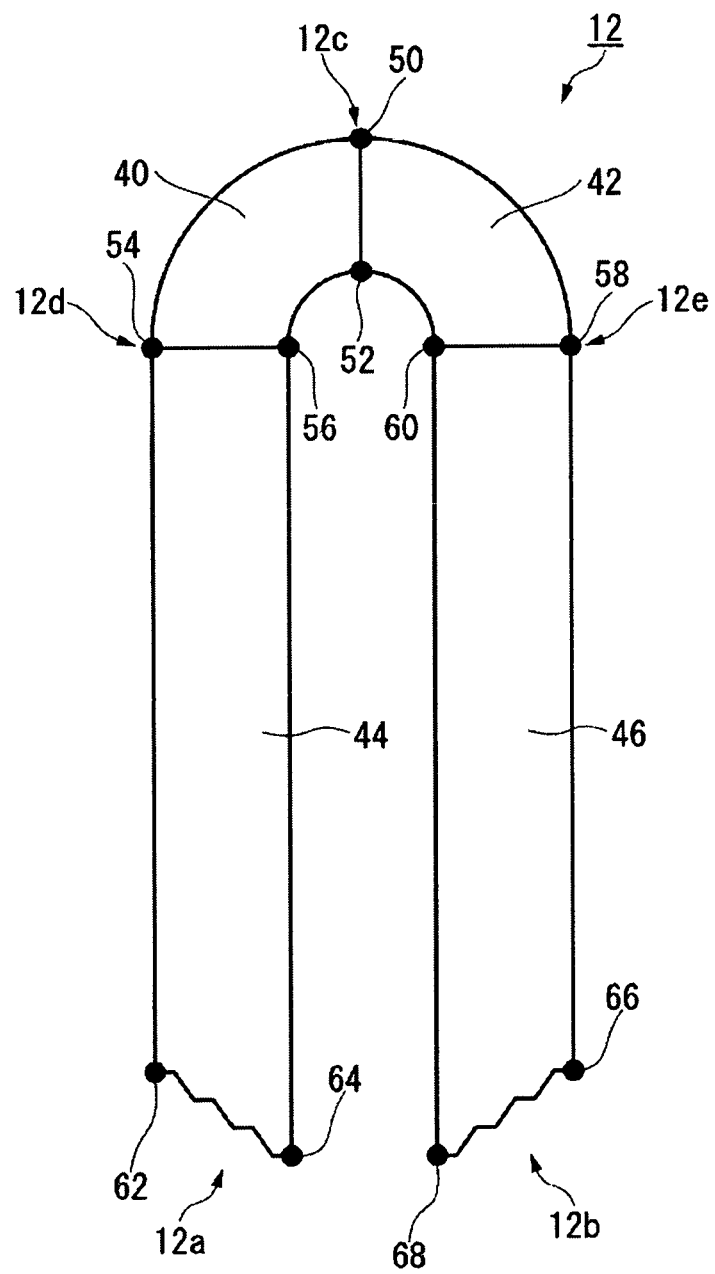

[FIG. 4]
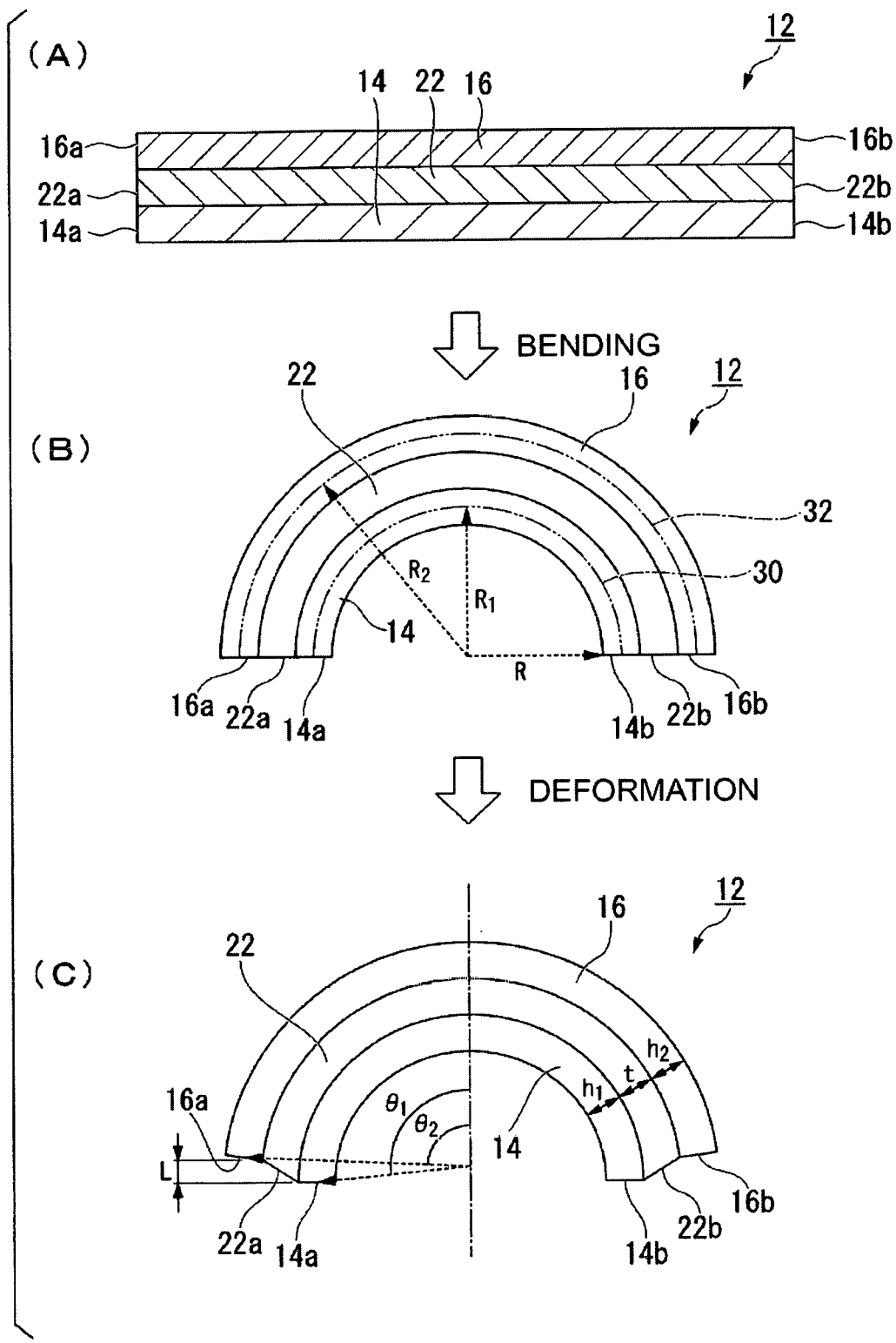

FLEXIBLE LAMINATE HAVING VISCOELASTICITY AND FLEXIBLE DISPLAY USING SAME

CROSS-REFERENCE TO RELATED APPLICATIONS

This application is the National Stage of International Application No. PCT/JP2017/005979 filed on 17 Feb. 2017, which claims priority to and all advantages of Japanese Patent Appl. No. 2016-028696 filed on 18 Feb. 2016, the content of which is hereby incorporated by reference.

TECHNICAL FIELD

The present invention relates to a flexible laminate and a flexible display using the same, and in particular, relates to a mechanism for achieving increased flexibility and durability.

BACKGROUND ART

Displays are conventionally used in various electric and electronic devices. Until now, displays having structures that do not bend have been generally used, but in recent years, flexible displays having bendable structures have attracted attention. As an example of a flexible display of the related art, there are flexible substrates in which an electrode layer, a light-emitting layer, and a protective layer are laminated (for example, Patent Document 1). According to such flexible displays, since the screen can be bent, carrying and storing of the electric/electronic device becomes convenient. As an example of a flexible AMOLED device, Non-Patent Document 1 discloses a flexible laminate including, in this order, a backup base layer, a light-emitting layer such as an OLED layer, an electrode layer such as an ITO layer, and a protective base layer. In particular, FIG. 4 on page 7 of the same document illustrates the schematic structure of the flexible display. In addition, Non-Patent Document 2 (for example, p. 15 of the same document) presents a concept of a neutral plane in a flexible laminate at the time of bending in a bendable AMOLED device.

CITATION LIST

Patent Literature

Patent Document 1: JP 2014-153711A

Non-Patent Documents

Non-Patent Document 1: "Information DISPLAY", JANUARY/FEBRUARY 2015, VOL. 31, NO. 1 p. 6-11, "Technologies for Flexible AMOLEDs" (Soonkwang Hong et al)

Non-Patent Document 2: "Information DISPLAY", JANUARY/FEBRUARY 2015, VOL. 31, NO. 1 p. 12-16, "Foldable AMOLED Display Development: Progress and Challenges" (Jing-Yi Yan et al)

SUMMARY OF INVENTION

Technical Problem

Based on the needs from consumers, there is demand for specifications with high functionality and storability that have been imparted with bendable, foldable, and rollable functionality. In addition, for the sake of product diversification, it is necessary for display makers to stably supply high flexibility functionality while balancing durability and cost.

However, since a plurality of hard base materials such as a protective layer, a light-emitting layer, an electrode layer and the like are laminated, such displays that target flexibility become thicker and difficult to bend, such that when attempted to be compactly bent in a forcible manner, an internal stress that exceeds the adhesive strength is applied, damage occurs due to peeling or the like, and practical use is difficult.

In order to prevent breakage of flexible displays caused by such internal stress, it is also conceivable to fix the laminated base materials of the flexible display more firmly.

However, even if the laminated base materials are firmly fixed, at the time of bending, the bending stress reaches the strength of the laminated base material, the bending stress increases due to lamination, or the like, and the flexible display remains likely to be damaged. In the related art, the best that could be done as a countermeasure thereof was to position the most delicate light-emitting layer at the center portion of the laminated base material, and no effective means was available.

The present invention has been made in view of the above-described problems of the related art, and has an object of providing a flexible laminate in which it is possible to achieve both flexibility and durability, and a flexible display using the flexible laminate.

Solution to Problem

As a result of intensive consideration of the aforementioned problems by the present inventors, it was discovered that the causes of damage to the flexible display are as follows. That is, when the flexible display is bent, stress interference occurs between adjacent hard layers of the flexible laminate, such that the hard layers are likely to break. When the hard layers break, the flexible laminate also breaks. In addition, it was discovered that, despite having a multi-layer structure, the cause of the stress interference between the hard layers in a general flexible laminate was that there was only one neutral plane to which stress was not applied.

It is known that interposing an intermediate layer between two bonded hard layers is very effective in preventing damage to such flexible laminates. However, as further investigation was conducted of the causes of such damage, it was discovered that when a flexible laminate in which two hard layers are bonded together to interpose an intermediate layer therebetween is bent, one layer shifts in a direction parallel to a laminate surface direction with respect to another hard layer bonded to the intermediate layer. That is, by means of the intermediate layer, since one of the hard layers and the other hard layer are bent independently from each other, the interference of stress between the hard layers can be greatly reduced and damage to the flexible displays can be greatly prevented.

In order to more reliably ensure that the plurality of hard layers bend independently from each other, it was found that it was very important to construct the intermediate layer such that there are a plurality, that is, as many as there are in the hard layers, of neutral planes to which stress is not applied in the flexible laminate, and the present invention was completed.

That is, in order to achieve the above object, the flexible laminate according to the present invention includes one or more units of a laminate structure in which two hard layers interposing one or more intermediate layers are bonded together as one unit. Here, the intermediate layer has viscoelasticity, and in a case that the flexible laminate is bent, a neutral plane is formed in each inner portion of the hard layers that are bonded together to interpose the intermediate layer therebetween.

It should be noted that, in non-Patent Document 2, only one layer of a neutral plane is formed inside the laminate, and no mention or suggestion has been made regarding a flexible laminate having a plurality of neutral planes, specifically a flexible laminate or the characteristics thereof in which a neutral plane is formed in another electrode layer or the like without having a neutral plane in the intermediate layer. In addition, such concepts are not presented in any known literature including the present technical field.

In the flexible laminate according to the present invention, in a case that the flexible laminate is bent, it is preferable that a neutral plane not be formed inside the intermediate layer, and instead that neutral planes be formed in each inner portion of the hard layers that are bonded together to interpose the intermediate layer therebetween. When a Young's modulus $E_H$ of each hard layer, a Young's modulus $E_T$ of the intermediate layer, a sectional moment of inertia of the hard layer $I_H$, and a sectional moment of inertia of the intermediate layer $I_H$ are defined for the one unit of the laminate structure, by designing a value of $E_H * I_H$ to be at least 10 times a value of $E_T * I_T$, such a flexible structure can be suitably realized.

In the flexible laminate of the present invention, even if the position of the neutral plane to which stress is not applied moves between a boundary surface of one hard layer and another boundary surface when the flexible laminate is bent, a neutral plane to which stress is not applied is always present inside the hard layer, and even when bent from 90 to 180 degrees, a neutral plane is not formed in the intermediate layer. Here, the neutral plane refers to a surface where the mechanical stress in the horizontal direction becomes zero in the base material during deformation, such as bending of the flat base material. In the present invention, since a neutral plane exists in each flat plate member (hard layer) that constitutes the flexible laminate in order to allow the plurality of hard layers to bend independently of each other, damage, interface peeling or the like does not occur between the layers constituting the laminate, and it is possible to prevent breakage when forming flexible displays and to form a stable, integrated-type flexible laminate.

In addition, in the flexible laminate according to the present invention, it is preferable for a support mechanism to be provided. Here, the support mechanism interposes the flexible laminate from a laminate direction such that, in a case that the flexible laminate is bent, the other hard layer shifts, via the intermediate layer, only in a direction substantially parallel to a laminate surface direction with respect to one of the hard layers that are bonded together to interpose the intermediate layer therebetween. Such an interposing structure is not particularly limiting, and as long as the hard layer does not substantially deform or move in the laminate direction, the interposing structure can have a desired structure, and the location and number of the interposing points are not limited.

In the flexible laminate according to the present invention, it is preferable that a step be formed at the end portion of the flexible laminate for when the flexible laminate is bent. Here, the step corresponds to a shift of the other hard layer with respect to one of the hard layers that are bonded together to interpose the intermediate layer therebetween.

In the flexible laminate according to the present invention, in the case that the flexible laminate is bent with a constant radius of curvature to be substantially U-shaped, it is preferable for the intermediate layer to be configured to substantially satisfy the relationships represented by the relational formulas (1) to (3), for a material inherent fracture strain to exceed the maximum shear strain defined by relational formula (5) in a maximum shear strain region when the flexible laminate is bent, and for a material inherent fracture shear stress to exceed a maximum shear stress defined by relational formula (4) in the maximum shear strain region when the flexible laminate is bent.

That is, in the flexible laminate according to the present invention, it is preferable for a material, that is, an intermediate layer (material property), to be utilized that has a structure according to the structure indicated by the relational formulas (1) to (3), and in which the material inherent physical properties constituting the intermediate layer exceed the lower limits of the physical properties given by the relational formula (4) and the relational formula (5). By satisfying such structural and material conditions, the object of the present invention can be suitably attained.

$$R_1 \theta_1 = R_2 \theta_2 \quad (1)$$

$$R_2 - R_1 = t + (h_1 + h_2)/2 \quad (2)$$

$$L = (\theta_1 - \theta_2)(R_1 + R_2)/2 \quad (3)$$

$$\tau_{xy} = G * L/t \quad (4)$$

$$\gamma (=2\varepsilon_{xy}) = L/t \quad (5)$$

Here, in the above relational formulas (1) to (5), $R_1$ is a curvature radius at the center of the thickness direction of one of the hard layers bonded to the intermediate layer. $R_2$ is a curvature radius at the center of the thickness direction of the other hard layer bonded to the intermediate layer. $\theta_1$ is a curvature angle at the center of the thickness direction of one of the hard layers bonded to the intermediate layer. $\theta_2$ is a curvature angle at the center of the thickness direction of the other hard layer bonded to the intermediate layer. t is the thickness of the intermediate layer. $h_1$ is the thickness of one of the hard layers bonded to the intermediate layer. $h_2$ is the thickness of the other hard layer bonded to the intermediate layer. L is a shift amount of the other hard layer with respect to one of the hard layers bonded to the intermediate layer at a curvature end portion of the curvature radius $(R_1+R_2)/2$. $\tau_{xy}$ is the shear stress of the intermediate layer. G is the elastic shear modulus of the intermediate layer. $\gamma(=2\varepsilon_{xy})$ is the shear strain of the intermediate layer. $\varepsilon_{xy}$ is a strain tensor.

In the flexible laminate according to the present invention, it is preferable that the shift amount L of the other hard layer with respect to one hard layer at the curvature end portion of the curvature radius $((R_1+R_2)/2)$ be substantially identical to the shift amount of the other hard layer with respect to one hard layer at the end portion of the flexible laminate. Here, the fact that the shift amounts are substantially identical means that the difference in the shift amount is within 5%, preferably within 1%, and most preferably within 0.5%.

In the flexible laminate according to the present invention, it is preferable that the intermediate layer be configured from at least one type of adhesive selected from the group consisting of: a silicone-based pressure sensitive adhesive, an acrylic-based pressure sensitive adhesive, and a urethane-based pressure sensitive adhesive. It should be noted that, from the viewpoint of economic efficiency, the adhesion to other base materials, and durability, an acrylic-based pressure sensitive adhesive can be selected. However, from the viewpoint of excellent heat resistance/cold resistance and durability, a silicon-based pressure sensitive adhesive is more preferable, and from the viewpoint of excellent transparency, the silicone-based pressure sensitive adhesive is more preferable.

In the flexible laminate according to the present invention, with regard to the adhesive that constitutes the intermediate layer, it is particularly preferable to utilize an adhesive layer having a loss factor tan δ in a range of 0.2 to 5.0 at a shear frequency of 1 Hz in a temperature range of −40° C. to 100° C., more particularly within a temperature range of −20° C. to 85° C. Put differently, this is because when the loss factor tan δ of the adhesive layer is less than 0.2 at a shear frequency of 1 Hz, stickiness is unlikely to appear, and when the loss factor tan δ of the adhesive layer at a shear frequency of 1 Hz exceeds 5.0, the holding ability of the structure cannot be maintained. Here, the loss factor can be measured with the adhesive alone by using a device such as a Rheometer manufactured by Anton Paar Co. Ltd. It should be noted that the loss factor tan δ of the adhesive constituting the adhesive layer is a value measured for an adhesive (cured product) that is cured as a member of the flexible laminate when an adhesive composition is in a liquid state or a semi-cured state prior to coating/application or molding.

In the flexible laminate according to the present invention, it is preferable that the other end portion of the flexible laminate be able to bend 90 degrees or more with respect to the one end portion of the flexible laminate.

In the flexible laminate according to the present invention, it is preferable that one hard layer of the hard layers that are bonded together to interpose the intermediate layer therebetween is a light emitting layer for a flexible display, and the other hard layer is one or more types selected from: a support layer, an optical functional layer, a protective layer, and a flexible display transparent electrode layer.

In addition, in order to achieve the above object, the flexible display according to the present invention is provided with the flexible laminate according to the present invention, one hard layer of the hard layers that are bonded together to interpose the intermediate layer therebetween is a light-emitting layer, and the other hard layer is one or more types selected from: a support layer, an optical functional layer, a protective layer, and a transparent electrode layer.

Advantageous Effects of Invention

According to the flexible laminate of the present invention, when the flexible laminate is bent, since a neutral plane is formed inside each of the hard layers by the viscoelastic intermediate layer, even when the flexible laminate is bent, damage to the flexible laminate can be greatly reduced.

In the present invention, when the flexible laminate is bent, by forming a neutral plane in each inner portion of the hard layers that are bonded together to interpose the intermediate layer therebetween without a neutral plane being formed inside the intermediate layer, it is possible to more reliably achieve an increase in both flexibility and durability of the flexible laminate. When one or more units of a laminate structure in which two hard layers interposing one or more intermediate layers are bonded together is regarded as one unit, and when a Young's modulus $E_H$ of each hard layer, a Young's modulus $E_T$ of the intermediate layer, a sectional moment of inertia of the hard layer $I_H$, and a sectional moment of inertia of the intermediate layer $I_H$ are defined for the one unit of the laminate structure, such a flexible laminate can be suitably realized in cases where the value of $E_H*I_H$ is at least 10 times the value of $E_T*I_T$.

In the present invention, by supporting the flexible laminate with a support mechanism such that a hard layer only shifts in a direction substantially parallel to a laminate surface direction with respect to another hard layer of the hard layers that are bonded together to interpose the intermediate layer therebetween, it is possible to more reliably achieve an increase in both flexibility and durability of the flexible laminate.

In the present invention, by configuring the flexible laminate such that the intermediate layer is configured to substantially satisfy the relationships represented by the above-mentioned relational formulas (1) to (3), and designing such that a material inherent fracture shear stress exceeds the maximum shear stress defined by the above relational formula (4) in a maximum shear strain region when the flexible laminate is bent, and a material inherent fracture strain exceeds the maximum shear strain defined by the above relational formula (5) in the maximum shear strain region when the laminate is bent, it is possible to more reliably achieve an increase in both flexibility and durability of the flexible laminate. In particular, by configuring the shift amount L of the other hard layer with respect to one of the hard layers at the curvature end portion of the curvature radius R to be substantially identical to the shift amount of the other hard layer with respect to one of the hard layers at the end portion of the flexible laminate, it is possible to more reliably achieve an increase in both flexibility and durability of the flexible laminate.

In the present invention, by configuring the intermediate layer from at least one type of adhesive selected from the group consisting of a silicone-based pressure sensitive adhesive, an acrylic-based pressure sensitive adhesive, and a urethane-based pressure sensitive adhesive, it is possible to more reliably achieve an increase in both flexibility and durability of the flexible laminate. It is more preferable that the loss factor tan δ of such an adhesive at a shear frequency of 1 Hz be in the range of 0.2 to 5.0. Since this loss factor can be easily measured using known measurement means with the adhesive alone, it is extremely useful from the viewpoint of flexible laminate design. In particular, the loss factor tan δ may be measured by a MCR 301 Rheometer (manufactured by Anton Paar Co. Ltd), and the measurement conditions were as follows: a disc-shaped sample having a diameter of 8 mm and a thickness of 1 mm was used with an 8 mm parallel plate, a frequency of 1 Hz, a strain of 0.1%, a temperature increase rate 3° C./min, and a use temperature within the range of −40° C. to 100° C. Here, the use temperature is the use temperature of the flexible laminate, and generally includes cold regions to high temperature conditions in the temperature range of −40° C. to 100° C., but considering that the flexible laminate is a flexible display that includes a touch panel or the like, it is more preferable for practical use of the present invention if a temperature of −20° C. to 85° C. is used as the use temperature, and the loss factor tan δ of the adhesive constituting the adhesive layer be in a range of 0.2 to 5.0 within the temperature range. It should be noted that the loss factor tan δ of the adhesive constituting the adhesive layer is a value measured for an adhesive (cured product) that is cured as a member of the flexible laminate when an adhesive composition is in a liquid state or a semi-cured state prior to coating/application or molding.

In the present invention, by making one of the hard layers that are bonded together to interpose the intermediate layer therebetween a light-emitting layer for a flexible display, and by making the other hard layer one or more types selected from a support layer, an optical functional layer, a protecting material or a flexible display transparent electrode layer, it is possible to impart excellent flexibility and durability.

In addition, in order to achieve the above-mentioned object, since the flexible display according to the present invention is provided with the flexible laminate according to the present invention, it is possible to achieve both further flexibility and a further increase to the durability of the flexible display.

BRIEF DESCRIPTION OF DRAWINGS

FIG. 1 is an explanatory diagram of a schematic configuration of a flexible display using a flexible laminate according to one embodiment of the present invention.

FIG. 2 is an explanatory diagram illustrating a bent state of the flexible laminate depicted in FIG. 1.

FIG. 3 is an explanatory diagram of an effect of the flexible laminate according to an embodiment of the present invention.

FIG. 4A, FIG. 4B, and FIG. 4C are partial views of the flexible laminate depicted in FIG. 3.

DESCRIPTION OF EMBODIMENTS

Hereinafter, a preferred embodiment of the present invention will be described with reference to the drawings. FIG. 1 illustrates a schematic configuration of a flexible display using a flexible laminate according to one embodiment of the present invention. It should be noted that, in FIG. 1, the flat state of the flexible display according to the present embodiment is depicted.

The flexible laminate 10 illustrated in FIG. 1 includes a flexible laminate 12 having a flexible structure. In the flexible laminate 12, 14, 16, 18, and 20 denote hard layers, which include a backup base layer, a light-emitting layer such as an OLED layer, an inorganic layer such as an ITO layer, a protective base layer, and the like.

The characteristic features of the present invention are that one or more units of a laminate structure in which two hard layers interposing one or more intermediate layers having viscoelasticity are bonded together as one unit, and in a case that the flexible laminate is bent, a neutral plane is formed in each inner portion of the hard layers that are bonded together to interpose the intermediate layer therebetween. Such a mechanical feature can be explained in that, when the flexible laminate is bent, a neutral plane is formed in each inner portion of the hard layers that are bonded together to interpose the intermediate layer therebetween without a neutral plane being formed inside the intermediate layer. Further, when a Young's modulus $E_H$ of each hard layer, a Young's modulus $E_T$ of the intermediate layer, a sectional moment of inertia of the hard layer $I_H$, and a sectional moment of inertia of the intermediate layer $I_H$ are defined for the one unit of the laminate structure, by selecting a base material and an intermediate layer of the hard layers such that the value of $E_H*I_H$ is at least 10 times or more, preferably 15 times or more, or more preferably 20 times or more than the value of $E_T*I_T$, such a structure can be suitably achieved. In a case that the flexible laminate has one unit with a plurality of laminate structures (that is, a laminate with four or more layers), it is preferable that the value of $E_H*I_H$ be at least 10 times or more than the value of $E_T*I_T$ for each laminate structure unit constituting the laminate. It should be noted that when the value of $E_H*I_H$ is close to the value of $E_T*I_T$ (in particular, less than 10 times greater), the tendency for the hard layers and the intermediate layers of the laminates in the laminate structure unit to behave as a single unit increases, a neutral plane is formed inside the intermediate layer at the time of bending, and damage to the entire flexible laminate, peeling of the interface, or the like may occur.

Accordingly, in the present embodiment, the laminate structure of the present invention is configured to have three units; that is, it is provided with a first laminate structure, a second laminate structure, a third laminate structure, and four neutral planes are formed. That is, in the flexible laminate 12 illustrated in FIG. 1, as the first laminate structure, a hard layer 14 and a hard layer 16 are bonded together with an intermediate layer 22 interposed therebetween. As the second laminate structure, the hard layer 16 and a hard layer 18 are bonded together with an intermediate layer 24 interposed therebetween. As the third laminate structure, the hard layer 18 and a hard layer 20 are bonded together with an intermediate layer 26 interposed therebetween.

In the present invention, the intermediate layer can be composed from at least one type of adhesive selected from the group consisting of a silicone-based pressure sensitive adhesive, an acrylic-based pressure sensitive adhesive, and a urethane-based pressure sensitive adhesive, but in the present embodiment, the intermediate layers 22, 24, and 26 are composed of a silicone-based pressure sensitive adhesive (PSA), which has excellent transparency and serves well as the intermediate layer in the present invention. In the present embodiment, by providing a flexible laminate 12 with the intermediate layers 22, 24, and 26 composed of the silicone-based pressure sensitive adhesive, four neutral planes are formed in the flexible laminate 12.

Hereinafter, the neutral plane will be described in more detail with reference to FIG. 2. FIG. 2 illustrates a state in which the flexible laminate 12 depicted in FIG. 1 is bent. In the present embodiment, the intermediate layer 22 forms a neutral plane 30 in the hard layer 14, and also forms a neutral plane 32 in the hard layer 16. The intermediate layer 24 forms the neutral plane 32 in the hard layer 16, and also forms a neutral plane 34 in the hard layer 18. The intermediate layer 26 forms the neutral plane 34 in the hard layer 18, and also forms a neutral plane 36 in the hard layer 20.

For this reason, according to the present embodiment, the other end of the flexible display can be bent by 90 degrees or more with respect to one end of the flexible display without damaging the flexible display. For example, as illustrated in FIG. 2, even if the other end portion 12b is bent 180 degrees with respect to the one end portion 12a of the flexible laminate 12, damage to the flexible display can be significantly reduced. That is, as illustrated in FIG. 2, when the flexible laminate 12 is bent, a shift is caused in a direction that is substantially parallel to the laminate surface direction between one hard layer and another hard layer that are bonded together to interpose the intermediate layer therebetween. It should be noted that the substantially parallel direction indicates that ideally, deformation or movement in the laminate direction does not occur at all, and even if it does occur it is extremely minor, and remains at a negligible level in consideration of the thickness of the intermediate layer.

In the present embodiment, at one end portion 12a of the flexible laminate 12, one end portion 16a of the hard layer 16 is shifted upward (in a direction parallel to the laminate surface direction) in FIG. 2 with respect to the one end portion 14a of the hard layer 14 by means of the intermediate layer 22. At the other end portion 12b of the flexible laminate 12 as well, the other end portion 16b of the hard layer 16 is shifted upward in FIG. 2 with respect to the other end portion 14b of the hard layer 14 by means of the intermediate layer 22.

At one end portion 12a of the flexible laminate 12, one end portion 18a of the hard layer 18 is shifted upward in FIG. 2 with respect to the one end portion 16a of the hard layer 16 by means of the intermediate layer 24. At the other end portion 12b of the flexible laminate 12 as well, the other end portion 18b of the hard layer 18 is shifted upward in FIG. 2 with respect to the other end portion 16b of the hard layer 16 by means of the intermediate layer 24.

At one end portion 12a of the flexible laminate 12, one end portion 20a of the hard layer 20 is shifted upward in FIG. 2 with respect to the one end portion 18a of the hard layer 18 by means of the intermediate layer 26. At the other end portion 12b of the flexible laminate 12 as well, the other end portion 20b of the hard layer 20 is shifted upward in FIG. 2 with respect to the other end portion 18b of the hard layer 18 by means of the intermediate layer 26.

Accordingly, in the case that a neutral plane is formed in all the hard layers as in the flexible laminate 12 according to the present embodiment, when one end portion 14a (one end portion of the flexible laminate 12) of the hard layer 14 and another end portion 14b (the other end portion of the flexible laminate 12) are positioned on the same horizontal plane, it can be observed that, at the one end portion 12a of the flexible laminate 12, a continuous step is formed from one end portion 14a of the hard layer 14 to one end portion 16a of the hard layer 16, one end portion 18a of the hard layer 18, and one end portion 20a of the hard layer 20. At the other end portion 12b of the flexible laminate 12 as well, it can be observed that a continuous step is formed from the other end portion 14b of the hard layer 14 to the other end portion 16b of the hard layer 16, the other end portion 18b of the hard layer 18, and the other end portion 20b of the hard layer 20.

In contrast, in general flexible laminates, since one neutral plane is formed in only one of the plurality of hard layers, the end faces of the flexible laminates are flush, and a step as depicted in FIG. 2 cannot be observed on the end faces of general flexible laminates.

In this way, in the present embodiment, a neutral plane exists in all of the hard layers that constitute the flexible laminate 12. That is, a neutral plane 30 is formed in the hard layer 14. A neutral plane 32 is formed in the hard layer 16. A neutral plane 34 is formed in the hard layer 18. A neutral plane 36 is formed in the hard layer 20.

Accordingly, in the present embodiment, force interference between the hard layers can be prevented. That is, in the present embodiment, the force interference between the hard layer 14 and the hard layer 16 can be prevented by the intermediate layer 22. The force interference between the hard layer 16 and the hard layer 18 can be prevented by the intermediate layer 24. The force interference between the hard layer 18 and the hard layer 20 can be prevented by the intermediate layer 26. In the present embodiment, since the force inference between the respective hard layers can be prevented, damage to the flexible laminate 12 can be greatly reduced even if the flexible laminate 12 is compactly bent.

It should be noted that, in the present embodiment, when the flexible laminate is bent, in order to allow the other hard layer to shift smoothly only in a direction substantially parallel to a laminate surface with respect to one of the hard layers that are bonded together to interpose the intermediate layer therebetween, inclusion of the following support mechanism is very important.

Hereinafter, the support mechanism will be described in more detail with reference to FIG. 3. In FIG. 3, when the flexible laminate 12 is bent such that the flexible laminate 12 forms a U-shape, curved portions 40, 42, and linear portions 44, 46 are formed in the flexible laminate 12.

In the present embodiment, the support means 50, 52, 54, 56, 58, 60, 62, 64, 66, and 68 illustrated in FIG. 3 are provided as the support mechanism of the present invention. That is, the support means 50 and 52 are arranged to oppose each other with an intermediate portion 12c of the flexible laminate 12 interposed therebetween. The support means 50 and 52 interpose the intermediate portion 12c of the flexible laminate 12 at the intermediate portion 12c of the flexible laminate 12 such that the hard layers do not move in the laminate direction.

In FIG. 3, the support means 54 and 56 are arranged to oppose each other with one curvature end portion 12d (a boundary portion between the curved portion 40 and the linear portion 44) of the flexible laminate 12 interposed therebetween. At one curvature end portion 12d of the flexible laminate 12, the support means 54 and 56 interpose the one curvature end portion 12d of the flexible laminate 12 such that each hard layer shifts in a direction substantially parallel to the laminate surface direction without shifting in the laminate direction.

In FIG. 3, the support means 58 and 60 are arranged to oppose each other with the other curvature end portion 12e (a boundary portion between the curved portion 42 and the linear portion 46) of the flexible laminate 12 interposed therebetween. At the other curvature end portion 12e of the flexible laminate 12, the support means 58 and 60 interpose the other curvature end portion 12e of the flexible laminate 12 such that each hard layer shifts in a direction substantially parallel to the laminate surface direction without shifting in the laminate direction.

In the vicinity of the one end portion 12a of the flexible laminate 12, the support means 62 and 64 interpose the flexible laminate 12 from the laminate direction such that each hard layer constituting the flexible laminate 12 shifts in a direction substantially parallel to the laminate surface direction without shifting in the laminate direction. In the present embodiment, the support means 62 and 64 do not constrain the shifting of the laminate 12 at the one end portion 12a, and freely allow it. For this reason, with this state retained in the linear portion 44 as well, the shift at the one curvature end portion 12d of the flexible laminate 12 appears substantially similarly at the one end portion 12a of the flexible laminate 12. Here, as illustrated in the drawings, the fact that the shift amounts are substantially the same means that the lengths, which are the shift amounts, are substantially equal, and that the difference between these lengths is within 5%, preferably within 1%, and most preferably within 0.5%.

In the vicinity of the other end portion 12b of the flexible laminate 12, the support means 66 and 68 interpose the flexible laminate 12 from the laminate direction such that each hard layer constituting the flexible laminate 12 shifts in a direction parallel to the laminate surface direction without shifting in the laminate direction. In the present embodiment, the support means 66 and 68 do not constrain the shifting of the laminate 12 at the other end portion 12b, and freely allow it. For this reason, with this state retained in the linear portion 46 as well, the shift at the other curvature end portion 12e of the flexible laminate 12 appears substantially similarly at the other end portion 12e of the flexible laminate 12.

In this way, by supporting the flexible laminate 12 with the support mechanism while allowing shifting at the one end portion 12a of the flexible laminate 12 and the shifting at the other end portion 12b and making them free, a neutral plane can be reliably formed in all of the hard layers.

In the present embodiment, in order to reliably retain the strain state at the curvature end portions 12d and 12e of the flexible laminate 12 at the end portions 12a and 12b of the flexible laminate 12 as well, consideration of the following points is also very important.

It is preferable that the fracture strain of the intermediate layer exceeds the maximum shear strain in the maximum shear strain region (curvature end portions 12d, 12e).

It is preferable that the fracture shear stress of the intermediate layer exceeds the maximum shear stress in the maximum shear strain region (curvature end portions 12d, 12e).

It is preferable that the durability of the hard layer exceeds the maximum shear stress $\tau_{xy(max)}*S$ in the maximum shear strain region (curvature end portions 12d, 12e). Here, S is the length of the linear portion 44 (46).

It is preferable that $\tau_{xy(max)}*S$ be less than the buckling force F of the hard layer and the intermediate layer in the maximum shear strain region (curvature end portions 12d, 12e).

In order to maintain balance, it is preferable that the shear strain/shear stress of the uppermost layer of the flexible laminate 12 (for example, the hard layer 20 in FIG. 1) and the shear strain/shear stress of the lowermost layer (for example, the hard layer 14 in FIG. 1) be set to the same value.

As in the present embodiment, it is also preferable that the multi-layer intermediate layer have multiple functions, such as thermal stability and expandability.

In the present embodiment, when the flexible laminate is bent, since it can be assumed that each hard layer reliably has a neutral plane, and stress interference does not occur between the hard layers, the shift between hard layers can be calculated, and the shear strain of the intermediate layers interposed between each hard layer can be easily calculated using the following mathematical model.

Hereinafter, the mathematical model will be described in detail. It should be noted that, in the present embodiment, in order to simplify the explanation, the hard layer (the one hard layer) 14 and the hard layer (the other hard layer) 16 that are bonded together to interpose the intermediate layer 30 therebetween as illustrated in FIG. 4A will be used in the description. FIG. 4B does not illustrate the entirety of the flexible laminate 12 depicted in FIG. 3; that is, only the curved portions 40 and 42 are illustrated, and the linear portions 44 and 46 are omitted.

The shifted state depicted on the left side of FIG. 4C is a state in which the shifted state formed at the one end portion 12a of the flexible laminate 12 depicted in FIG. 3 is retained as it is and translated to the curved portion 40. The shifted state depicted on the right side of FIG. 4C is a state in which the shifted state formed at the one end portion 12b of the flexible laminate 12 depicted in FIG. 3 is retained as it is and translated to the curved portion 42. The reason why such a description is possible is because, according to the flexible laminate according to the present embodiment, the shift amount L of the other hard layer with respect to the one hard layer bonded to the intermediate layer at the curvature end portion of the curvature radius R is substantially the same as the shift amount of the other hard layer with respect to the one hard layer bonded to the intermediate layer at the end portion of the flexible laminate. It should be noted that the meaning of the phrase "the shift amounts are substantially the same" is the same as that described above.

In the case that a flexible laminate 12 is bent with a curvature radius R such that the flexible laminate 12 in the flat state depicted in FIG. 4A becomes a substantial U-shape as depicted in FIG. 2B, deformation as depicted in FIG. 4C occurs at the end of the flexible laminate 12. That is, as illustrated in FIG. 4C, the one end portion 16a of the hard layer 16 shifts upward in FIG. 4C by a shift amount L with respect to the one end portion 14a of the hard layer 14. Similarly, the other end portion 16b of the hard layer 16 is also shifted upward with respect to the other end portion 14b of the hard layer 14.

Here, the intermediate layer 22 is configured to satisfy the following relational formulas (6) to (8), and is designed such that the material inherent fracture strain exceeds the maximum shear strain defined by the relational formula (10) in the maximum shear strain region when the laminate is bent, and the material inherent fracture shear stress exceeds the maximum shear stress defined by the relational formula (9) in the maximum shear strain region when the laminate is bent.

$$R_1\theta_1 = R_2\theta_2 \qquad (6)$$

$$R_2 - R_1 = t + (h_1 + h_2)/2 \qquad (7)$$

$$L = (\theta_1 - \theta_2)(R_1 + R_2)/2 \qquad (8)$$

$$\tau_{xy} = G*L/t \qquad (9)$$

$$\gamma(=2\varepsilon_{xy}) = L/t \qquad (10)$$

Here, in the above relational formulas (6) to (10), $R_1$ is a curvature radius at the center position of the thickness direction of the hard layer (one hard layer) 14. $R_2$ is a curvature radius at the center position of the thickness direction the hard layer (the other hard layer) 16. $\theta_1$ is a curvature angle of the hard layer (the one hard layer) 14. $\theta_2$ is a curvature angle of the hard layer (the other hard layer) 16. t is the thickness of the intermediate layer 22. $h_1$ is a thickness of the hard layer (the one hard layer) 14. $h_2$ is a thickness of the hard layer (the other hard layer) 16. L is a shift amount of the hard layer (the other hard layer) 16 with respect to the hard layer (the one hard layer) 14 at the curvature end portion (the end portion of the flexible laminate 12) of the curvature radius R. $\tau_{xy}$ is the shear stress of the intermediate layer 22. G is the elastic shear modulus of the intermediate layer 22. $\gamma(=2\varepsilon_{xy})$ is the shear strain of the intermediate layer 22. $\varepsilon_{xy}$ is the strain tensor.

According to the flexible laminate according to the present embodiment, as a neutral plane in which stress is not applied exists in all of the hard layers, the shear strain of the intermediate layer that serves an important role in the flexible laminate according to the present embodiment can be obtained by a simple calculation from the above information such as the thickness, the curvature radius, the curvature angle, the shift amount, and the like, and a structure that satisfies the above relationships according to the physical properties of the base materials can be designed. In this way, in the present embodiment, the design of the intermediate layer can be performed more easily.

It should be noted that, in the above calculation, although the hard layer 14 and the hard layer 16 that are bonded together to interpose the intermediate layer 22 therebetween were described as examples, this also preferably applies to the hard layer 16 and the hard layer 18 that are bonded together to interpose the intermediate layer 24 therebetween, and this also preferably applies to the hard layer 18 and the hard layer 20 that are bonded together to interpose the intermediate layer 26 therebetween.

As described above, according to the flexible display of the present embodiment, since the flexible laminate according to the present embodiment is utilized, even if the flexible display is bent more compactly, damage to the flexible display can be greatly reduced. Therefore, according to the flexible display according to the present embodiment, it is possible to reliably achieve an increase in both flexibility and durability, which has been extremely difficult in the related art.

It should be noted that the flexible laminate and the flexible display of the present invention are not limited to the above embodiments, and various modifications are possible within the scope of the spirit of the invention. For example, although the number of units of the laminate structure of the present invention was made to be 3 units in the above embodiment, the number of units of the laminate structure of the present invention is not limited to 3 units, but may be 1 unit, 2 units, or greater than or equal to 4 units. In addition, although an example was described in the above embodiments in which the flexible laminate of the present invention is utilized in a flexible display, the flexible laminate can also be used in devices other than flexible displays that require a flexible laminate. In addition, the flexible display of the present invention can include layers other than the flexible laminate according to the present embodiment. Production examples of such a flexible laminate are not particularly limited, and it can be manufactured by known means such as vapor deposition or pressure bonding. In particular, in cases that the intermediate layer is configured from the above-described adhesive, (1) a method in which the above-described adhesive is cured or semi-cured as necessary as an adhesive layer, molded into a film shape, and attached or pressure bonded between the layers, (2) a method in which a liquid or semi-cured adhesive composition is coated/applied in a film shape between the layers, and the adhesive layer is formed between layers by heating or the like of all or a portion of the laminate, and (3) a method in which a semi-cured adhesive composition is attached or pressure bonded between the layers, and the adhesive layer is formed between the layers by heating or the like of all or a portion of the laminate are given as examples. However, the method for manufacturing the flexible laminate using an adhesive as an intermediate layer is not limited to these methods, and a known laminate manufacturing process may be utilized as desired.

The invention claimed is:

1. A flexible laminate comprising:
one or more units of a laminate structure in which two hard layers interposing one or more intermediate layers are bonded together as one unit;
wherein:
the intermediate layer has viscoelasticity;
in a case that the flexible laminate is bent, a neutral plane is formed in each inner portion of the hard layers that are bonded together to interpose the intermediate layer therebetween; and
when a Young's modulus EH of a hard layer, a Young's modulus ET of the intermediate layer, a sectional moment of inertia of the hard layer IH, and a sectional moment of inertia of the intermediate layer IH are defined for the one unit of the laminate structure, in a case that the flexible laminate is bent, a value of EH*IH is at least 10 times a value of ET*IT, and a neutral plane is formed in each inner portion of the hard layers that are bonded together to interpose the intermediate layer therebetween without a neutral plane being formed inside the intermediate layer.

2. The flexible laminate according to claim 1, wherein:
another hard layer is provided with a support mechanism interposing the flexible laminate from a laminate direction such that, in a case that the flexible laminate is bent, the other hard layer shifts, via the intermediate layer, only in a direction substantially parallel to a laminate surface direction with respect to one of the hard layers that are bonded together to interpose the intermediate layer therebetween.

3. The flexible laminate according to claim 2, wherein:
a step is formed at an end portion of the flexible laminate to correspond to a shift of the other hard layer with respect to one of the hard layers that are bonded together to interpose the intermediate layer therebetween in a case that the flexible laminate is bent.

4. The flexible laminate according to claim 1, wherein:
in a case that the flexible laminate is bent with a constant radius of curvature to be substantially U-shaped, the intermediate layer is configured to substantially satisfy relationships represented by relational formulas (1) to (3);
a material inherent fracture strain exceeds the maximum shear strain defined by relational formula (5) in a maximum shear strain region when the flexible laminate is bent; and
a material inherent fracture shear stress exceeds a maximum shear stress defined by relational formula (4) in the maximum shear strain region when the flexible laminate is bent:

$$R1\theta1=R2\theta2 \quad (1)$$

$$R2-R1=t+(h1+h2)/2 \quad (2)$$

$$L=(\theta1-\theta2)(R1+R2)/2 \quad (3)$$

$$\tau xy=G*L/t \quad (4)$$

$$\gamma(=2\varepsilon xy)=L/t \quad (5)$$

where, in the relational formulas (1) to (5);
R1 is a curvature radius at a center of a thickness direction of one hard layer bonded to the intermediate layer,
R2 is a curvature radius at a center of the thickness direction of the other hard layer bonded to the intermediate layer,
θ1 is a curvature angle at a center of the thickness direction of one hard layer bonded to the intermediate layer,
θ2 is a curvature angle at a center of the thickness direction of the other hard layer bonded to the intermediate layer,
t is a thickness of the intermediate layer,
h1 is a thickness of one hard layer bonded to the intermediate layer,
h2 is a thickness of the other hard layer bonded to the intermediate layer,
L is a shift amount of the other hard layer with respect to one hard layer bonded to the intermediate layer at a curvature end portion of the curvature radius (R1+R2)/2,
τxy is a shear stress of the intermediate layer,
G is an elastic shear modulus of the intermediate layer,
γ (=2εxy) is a shear strain of the intermediate layer, and
εxy is a strain tensor.

5. The flexible laminate according to claim 4, wherein:
another hard layer is provided with a support mechanism interposing the flexible laminate from a laminate direction such that, in a case that the flexible laminate is bent, the other hard layer shifts, via the intermediate layer, only in a direction substantially parallel to a laminate surface direction with respect to one of the hard layers that are bonded together to interpose the intermediate layer therebetween; and
the shift amount L is substantially identical to a shift amount of the other hard layer with respect to one of the hard layers bonded together to interpose the intermediate layer therebetween at the end portion of the flexible laminate.

6. The flexible laminate according to claim 1, wherein:
the intermediate layer that configures the flexible laminate is composed from at least one type of adhesive selected from the group consisting of: a silicone-based pressure sensitive adhesive, an acrylic-based pressure sensitive adhesive, and a urethane-based pressure sensitive adhesive.

7. The flexible laminate according to claim 1, wherein:
the intermediate layer that configures the flexible laminate is composed from at least one type of adhesive; and
a loss factor tanδ of the adhesive that configures the intermediate layer at a shear frequency of 1 Hz is in a range of 0.2 to 5.0 in a temperature range of −40° C. to 100° C.

8. The flexible laminate according to claim 1, wherein:
an end portion of the flexible laminate can be bent by 90 degrees or more with respect to one end portion of the flexible laminate.

9. The flexible laminate according to of claim 1, wherein:
one hard layer of the hard layers bonded together to interpose the intermediate layer therebetween is a light emitting layer for a flexible display, and the other hard layer is one or more types selected from: a support layer, an optical functional layer, a protective layer, and a flexible display transparent electrode layer.

10. A flexible display comprising the flexible laminate according to claim 9.

11. The flexible laminate according to claim 7, wherein:
the adhesive that configures the intermediate layer is selected from the group consisting of: a silicone-based pressure sensitive adhesive, an acrylic-based pressure sensitive adhesive, and a urethane-based pressure sensitive adhesive.

12. A flexible laminate comprising:
one or more units of a laminate structure in which two hard layers interposing one or more intermediate layers are bonded together as one unit;
wherein:
the intermediate layer has viscoelasticity;
in a case that the flexible laminate is bent, a neutral plane is formed in each inner portion of the hard layers that are bonded together to interpose the intermediate layer therebetween; and
another hard layer is provided with a support mechanism interposing the flexible laminate from a laminate direction such that, in a case that the flexible laminate is bent, the other hard layer shifts, via the intermediate layer, only in a direction substantially parallel to a laminate surface direction with respect to one of the hard layers that are bonded together to interpose the intermediate layer therebetween.

13. A flexible laminate comprising:
one or more units of a laminate structure in which two hard layers interposing one or more intermediate layers are bonded together as one unit;
wherein:
the intermediate layer has viscoelasticity;
in a case that the flexible laminate is bent, a neutral plane is formed in each inner portion of the hard layers that are bonded together to interpose the intermediate layer therebetween; and
in a case that the flexible laminate is bent with a constant radius of curvature to be substantially U-shaped, the intermediate layer is configured to substantially satisfy relationships represented by relational formulas (1) to (3);
a material inherent fracture strain exceeds the maximum shear strain defined by relational formula (5) in a maximum shear strain region when the flexible laminate is bent; and
a material inherent fracture shear stress exceeds a maximum shear stress defined by relational formula (4) in the maximum shear strain region when the flexible laminate is bent:

$$R1\theta1 = R2\theta2 \quad (1)$$

$$R2 - R1 = t + (h1 + h2)/2 \quad (2)$$

$$L = (\theta1 - \theta2)(R1 + R2)/2 \quad (3)$$

$$\tau xy = G*L/t \quad (4)$$

$$\gamma(=2\varepsilon xy) = L/t \quad (5)$$

where, in the relational formulas (1) to (5);
R1 is a curvature radius at a center of a thickness direction of one hard layer bonded to the intermediate layer,
R2 is a curvature radius at a center of the thickness direction of the other hard layer bonded to the intermediate layer,
θ1 is a curvature angle at a center of the thickness direction of one hard layer bonded to the intermediate layer,
θ2 is a curvature angle at a center of the thickness direction of the other hard layer bonded to the intermediate layer,
t is a thickness of the intermediate layer,
h1 is a thickness of one hard layer bonded to the intermediate layer,
h2 is a thickness of the other hard layer bonded to the intermediate layer,
L is a shift amount of the other hard layer with respect to one hard layer bonded to the intermediate layer at a curvature end portion of the curvature radius (R1+R2)/2,
τxy is a shear stress of the intermediate layer,
G is an elastic shear modulus of the intermediate layer,
γ (=2εxy) is a shear strain of the intermediate layer, and
εxy is a strain tensor.

14. The flexible laminate according to claim 13, wherein:
another hard layer is provided with a support mechanism interposing the flexible laminate from a laminate direction such that, in a case that the flexible laminate is bent, the other hard layer shifts, via the intermediate layer, only in a direction substantially parallel to a laminate surface direction with respect to one of the hard layers that are bonded together to interpose the intermediate layer therebetween; and
the shift amount L is substantially identical to a shift amount of the other hard layer with respect to one of the hard layers bonded together to interpose the intermediate layer therebetween at the end portion of the flexible laminate.

15. A flexible laminate comprising:
one or more units of a laminate structure in which two hard layers interposing one or more intermediate layers are bonded together as one unit;
wherein:
the intermediate layer has viscoelasticity;
in a case that the flexible laminate is bent, a neutral plane is formed in each inner portion of the hard layers that are bonded together to interpose the intermediate layer therebetween; and
in a case that the flexible laminate is bent with a constant radius of curvature to be substantially U-shaped, the intermediate layer is configured to substantially satisfy relationships represented by relational formulas (1) to (3);
a material inherent fracture strain exceeds the maximum shear strain defined by relational formula (5) in a maximum shear strain region when the flexible laminate is bent; and
a material inherent fracture shear stress exceeds a maximum shear stress defined by relational formula (4) in the maximum shear strain region when the flexible laminate is bent:

$$R1\theta1 = R2\theta2 \tag{1}$$

$$R2 - R1 = t + (h1+h2)/2 \tag{2}$$

$$L = (\theta1 - \theta2)(R1+R2)/2 \tag{3}$$

$$\tau xy = G*L/t \tag{4}$$

$$\gamma(=2\varepsilon xy) = L/t \tag{5}$$

where, in the relational formulas (1) to (5);
R1 is a curvature radius at a center of a thickness direction of one hard layer bonded to the intermediate layer,
R2 is a curvature radius at a center of the thickness direction of the other hard layer bonded to the intermediate layer,
θ1 is a curvature angle at a center of the thickness direction of one hard layer bonded to the intermediate layer,
θ2 is a curvature angle at a center of the thickness direction of the other hard layer bonded to the intermediate layer,
t is a thickness of the intermediate layer,
h1 is a thickness of one hard layer bonded to the intermediate layer,
h2 is a thickness of the other hard layer bonded to the intermediate layer,
L is a shift amount of the other hard layer with respect to one hard layer bonded to the intermediate layer at a curvature end portion of the curvature radius (R1+R2)/2,
τxy is a shear stress of the intermediate layer,
G is an elastic shear modulus of the intermediate layer,
γ (=2εxy) is a shear strain of the intermediate layer, and
εxy is a strain tensor; and
wherein the shift amount L is substantially identical to a shift amount of the other hard layer with respect to one of the hard layers bonded together to interpose the intermediate layer therebetween at the end portion of the flexible laminate.

16. A flexible laminate comprising:
one or more units of a laminate structure in which two hard layers interposing one or more intermediate layers are bonded together as one unit;
wherein:
the intermediate layer has viscoelasticity;
in a case that the flexible laminate is bent, a neutral plane is formed in each inner portion of the hard layers that are bonded together to interpose the intermediate layer therebetween; and
the intermediate layer that configures the flexible laminate is composed from at least one type of adhesive selected from the group consisting of: a silicone-based pressure sensitive adhesive, an acrylic-based pressure sensitive adhesive, and a urethane-based pressure sensitive adhesive.

17. A flexible laminate comprising:
one or more units of a laminate structure in which two hard layers interposing one or more intermediate layers are bonded together as one unit;
wherein:
the intermediate layer has viscoelasticity;
in a case that the flexible laminate is bent, a neutral plane is formed in each inner portion of the hard layers that are bonded together to interpose the intermediate layer therebetween; and
the intermediate layer that configures the flexible laminate is composed from at least one type of adhesive; and
a loss factor tanδ of the adhesive that configures the intermediate layer at a shear frequency of 1 Hz is in a range of 0.2 to 5.0 in a temperature range of −40° C. to 100° C.

18. A flexible laminate comprising:
one or more units of a laminate structure in which two hard layers interposing one or more intermediate layers are bonded together as one unit;
wherein:
the intermediate layer has viscoelasticity;
in a case that the flexible laminate is bent, a neutral plane is formed in each inner portion of the hard layers that are bonded together to interpose the intermediate layer therebetween; and
one hard layer of the hard layers bonded together to interpose the intermediate layer therebetween is a light emitting layer for a flexible display, and the other hard layer is one or more types selected from: a support layer, an optical functional layer, a protective layer, and a flexible display transparent electrode layer.

19. A flexible display comprising a flexible laminate, the flexible laminate comprising:
one or more units of a laminate structure in which two hard layers interposing one or more intermediate layers are bonded together as one unit;
wherein:
the intermediate layer has viscoelasticity;
in a case that the flexible laminate is bent, a neutral plane is formed in each inner portion of the hard layers that are bonded together to interpose the intermediate layer therebetween; and
one hard layer of the hard layers bonded together to interpose the intermediate layer therebetween is a light emitting layer for a flexible display, and the other hard layer is one or more types selected from: a support layer, an optical functional layer, a protective layer, and a flexible display transparent electrode layer.

\* \* \* \* \*